United States Patent

Baxter et al.

[11] Patent Number: 5,803,976
[45] Date of Patent: Sep. 8, 1998

[54] VACUUM WEB COATING

[75] Inventors: Ian Kenneth Baxter, Rochdale; Charles Arthur Bishop, Middlesborough, both of United Kingdom; David Charles McGee, Fogelsville, Pa.; Keith Watkins, Rochdale, United Kingdom

[73] Assignees: Imperial Chemical Industries PLC, London; General Vacuum Equipment Ltd., Bedford, both of England

[21] Appl. No.: 344,936

[22] Filed: Nov. 23, 1994

Related U.S. Application Data

[63] Continuation-in-part of Ser. No. 237,599, May 3, 1994.

[30] Foreign Application Priority Data

Nov. 9, 1993 [GB] United Kingdom ............... 9323034

[51] Int. Cl.⁶ .................................................. C23C 16/00
[52] U.S. Cl. .......................................... 118/726; 118/718
[58] Field of Search ................................ 118/718, 719, 118/726

[56] References Cited

U.S. PATENT DOCUMENTS

| | | | |
|---|---|---|---|
| 2,709,663 | 5/1955 | McLean | 118/726 |
| 3,081,201 | 3/1963 | Koller | 427/81 |
| 3,190,262 | 6/1965 | Bakish | 118/48 |
| 3,511,212 | 5/1970 | Burns | 118/718 |
| 3,683,847 | 8/1972 | Carleton | 118/718 |
| 3,924,563 | 12/1975 | Kessler | 118/718 |
| 4,321,299 | 3/1982 | Frazer | 428/247 |
| 4,682,565 | 7/1987 | Carrico | 118/719 |
| 4,842,893 | 6/1989 | Yializis | 427/44 |
| 4,864,967 | 9/1989 | Kleyer | 118/718 |
| 5,097,800 | 3/1992 | Shaw | 118/730 |
| 5,123,376 | 6/1992 | Kaneko | 118/718 |
| 5,224,441 | 7/1993 | Felts | 118/718 |
| 5,302,208 | 4/1994 | Grimm | 118/718 |

FOREIGN PATENT DOCUMENTS

| | | |
|---|---|---|
| 00652302A1 | 5/1995 | European Pat. Off. . |
| 4-371567 | 12/1992 | Japan ............... 118/726 |

*Primary Examiner*—Richard Bueker
*Assistant Examiner*—Jeffrie R. Lund

[57] ABSTRACT

In an apparatus for vacuum web coating, an evaporation means has a plurality of separately spaced outlet nozzles through which vapour is conveyed to a deposition zone at the surface of a chilled rotatable drum in a vacuum chamber over which drum the substrate web is advanced by a web transport system. The outlet nozzle arrangement advantageously comprises a plurality of linear slots disposed transversely to the web substrate path to deliver vapour at positions disposed sequentially in the direction of the web substrate advance, the nozzle outlets being disposed on an arcuate surface around, but spaced from, the curved surface of the rotatable drum. The apparatus is particularly suitable for applying thick coatings of material such as metal on paper or plastic films.

15 Claims, 5 Drawing Sheets

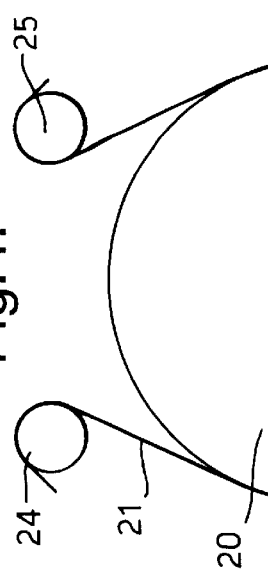
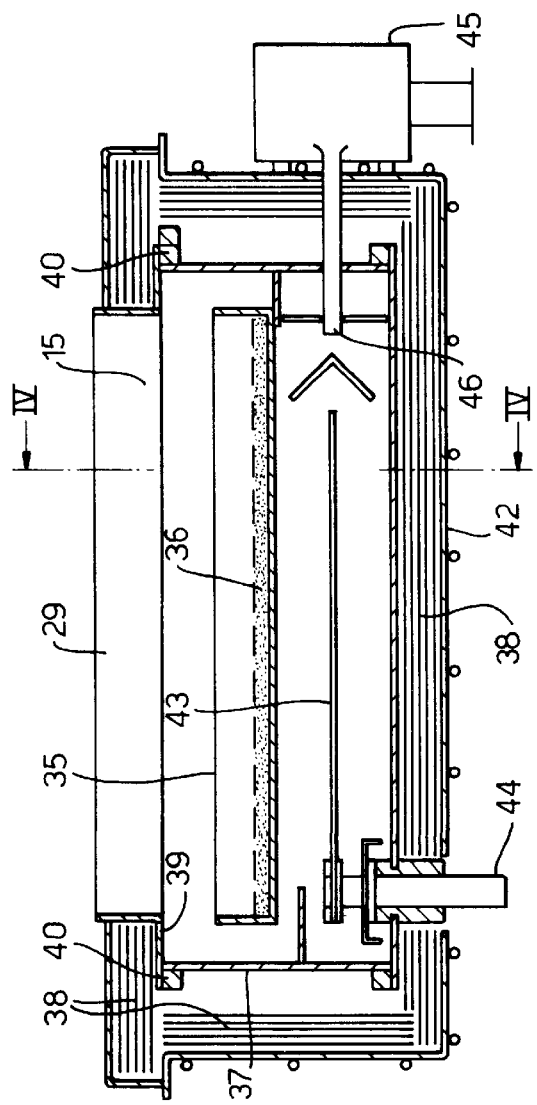

VACUUM WEB COATING

RELATED APPLICATION

This application is a continuation-in-part of U.S. Ser. No. 08/237,599 filed May 3, 1994 by the present applicants.

FIELD OF INVENTION

This invention relates to apparatus for vacuum web coating and to a method of web coating by vapour deposition of a coating of a material on a web substrate in vacuum.

BACKGROUND OF THE INVENTION

In vapour deposition processes coating material is vaporised in a heated crucible and the vapour is condensed on a surface of the web to be coated, the web generally being a large continuous web which is continuously moved through a vapour deposition zone by winding gear. The deposition zone is usually provided by a chilled metal surface and generally is a rotating cold drum over which the web is advanced. In order to avoid contaminants the coating process is carried out in a vacuum chamber at high vacuum wherein the pressure is generally in the range $10^{-2}$–$10^{-4}$ Torr and the process is accordingly termed vacuum web coating. The crucible is generally contained in an evaporation retort having an elongated outlet nozzle profiled as a slit disposed across the web path, through which nozzle the vaporised material is transferred to the web surface where it condenses as a thin film coating. Using appropriate transport systems one or both sides of a web may be coated with one or more coats of material. The thickness and uniformity of the film can be accurately maintained by controlling the rate of evaporation of the coating material and the time of exposure of the web substrate to the vapour emerging from the nozzle, the exposure time being generally controlled by controlling the travel speed of the web relative to the nozzle. Web coating by vapour deposition has been described in the book "Web Processing and Converting Technology (Van Nostrand Reinhold Company-1984)— Chapter 11 entitled "High-vacuum roll coating" by Ernst K Hartwig". Using this process, well defined film coatings of metals, alloys or other materials having thicknesses typically of less than 0.1 micron can be applied to substrates such as paper or plastics as thin as 1.0 micron. We have found, however, that for thicker coatings such as the 5–25 micron thick coatings currently required for certain film materials the uniformity of the coating, material collection efficiency and control of the substrate heat loading are inadequate. Overheating and consequent damage of thin substrates by hot thick coatings is a particularly serious problem.

An object of this invention is to provide an improved apparatus and method for vacuum web coating which gives improved uniformity, material collection efficiency and control of substrate heat loading particularly with thicker coatings.

SUMMARY OF THE INVENTION

In accordance with the invention apparatus for vacuum web coating comprises a vacuum chamber containing at least one rotatable cooling drum providing at a curved surface thereof at least one deposition zone;

a web transport system for advancing a web substrate to be coated over said curved surface along a path through said deposition zone;

and evaporation means for vaporising coating material to be deposited on said web;

said evaporation means providing a plurality of separately spaced outlet nozzles operatively disposed to convey vapour from said evaporation means to predetermined portions of said deposition zone extending along the web path at which portions the vapour is condensed on the surface of the advancing web; and the outlet ends of said nozzles being disposed on an arcuate surface around, but spaced from, the curved surface of the drum.

The evaporation means preferably comprises at least one sealed retort, each retort having at least one vapour outlet nozzle and being sealed except for the outlet nozzle or nozzles. Each retort conveniently contains at least one crucible in which material is heated to its vaporisation temperature. Heating means for heating the crucible may be disposed outside or inside the retort. When the evaporation means comprises only one retort the heating means is preferably enclosed within the retort. However, in evaporation means comprising 2 or more retorts a common heating means may be used to vaporise coating materials in 2 or more retorts and this may be conveniently outside the retorts. One convenient heating means is an electrically heated radiation source. Preferably at least one retort has a sealed lid in which at least one outlet nozzle is located, the lid being removable to allow recharging of the evaporation crucible as required and any replacement of the crucible or heating means. In order to facilitate rapid heating and cooling any retort and crucible preferably has low thermal capacity and the retort is preferably encased in a radiation shield which may comprise, for example, ceramic material, stainless steel or refractory metal such as tungsten, molybdenum or tantalum.

The nozzles may be of any convenient length and may be disposed in varying array to eject vapour to desired positions of the deposition zone. Likewise the profile, area, spacing and direction of the nozzle outlets may be varied as desired. Thus the outlets profiles may comprise circular, rectangular or star-shaped apertures which may be distributed in line or staggered over the area of the deposition zone. A further especially convenient nozzle profile is a continuous slot preferably extending over the width of the web to be coated. One advantageous nozzle arrangement comprises a plurality of linear slots disposed transversely to the web substrate path to deliver vapour to portions of the deposition zone disposed sequentially in the direction of the web substrate advance.

The sequential spacing of the nozzles may be varied as required, wider spacing being generally required for higher vapour temperatures.

The nozzle array need not be limited to a single group of nozzles from one retort. If desired, the nozzles may convey vapour from one or more retorts and may be disposed as required around a single cooling drum.

Deposition of the coating material from a plurality of nozzles sequentially positioned along the deposition zone in the direction of the web travel rather than at a single position has many advantages. The coating at any given position of the web is applied progressively at a rate which can be varied in thickness by varying the nozzle geometry thereby allowing better control of the structure and uniformity of the coating. The heat load to be removed at the cooling surface is distributed over a greater area so that the cooling is more efficient and the risk of damage or distortion of the web is diminished, thereby allowing thicker coatings, higher temperature vapours, the use of more delicate substrates or higher substrate speed. In this context overheating of the web substrate must be avoided since any damage or distortion impairing the contact with the cooling surface compounds the overheating and therefore the damage. The arcuate arrangement of the nozzles ends around the drum increases the vapour collection efficiency and allows the deposition zone to be extended around a greater segment of the drum thereby enabling the number of sequential nozzles to be increased. The improvement in vapour collection efficiency gives a reduction in the waste material which has to be cleaned from the apparatus after each production cycle. Extension of the deposition zone allows the web speed and/or the deposition rate to be increased thereby enabling thicker coatings or higher web throughput to be attained.

The nozzle profile may be varied, for example by varying the nozzle width or nozzle spacing, to give varying web coating rates over the length of the deposition zone. Thus the first upstream nozzle may deliver at a low coating rate with subsequent larger area nozzles delivering at higher coating rates. In this way delicate substrates may be coated without suffering damage from an initial high thermal load from the condensed vapour, and advantage may be taken of the progressively increasing heat capacity of the coated material as it is advanced through the deposition zone.

When the nozzles are profiled to convey substantially equal amounts of vapour it can be advantageous with thin substrates to have the arcuate surface on which the nozzles terminate convergent with the curved drum surface, so that the vapour collection efficiency and the deposition rate increases in a downstream direction.

Thus the apparatus may be varied and operated for any chosen combination of web thickness and web speed so as to attain the maximum deposition of material at any given position of the deposition zone without damaging the web.

The web transport system will generally comprise a web winding system having a pay-off roll and take-up roll, which may be located either outside or inside the vacuum chamber. Optionally, additional guide or tensioning rolls may be included as required. The web transport system may be arranged as required for coating one or both sides of the web in either a single or multiple pass through one or more deposition zones.

From another aspect the invention consists in a method of vacuum web coating wherein a web substrate is advanced over the curved surface of a rotatable cooling drum at a predetermined speed through a deposition zone at the surface of the drum; a coating material is vaporised by evaporation means, and the vapour is conveyed through a plurality of separately spaced outlet nozzles terminating on an arcuate surface around, but spaced from, the curved surface of the drum to impinge on a plurality of areas of the web substrate extending along the web path, at which areas the vapour is condensed to form a coating on the web substrate. The coating is thereby progressively applied to any given position of the advancing web substrate.

The coating material may be vaporised in at least one retort and the vapour fed to the web substrate in the form of jets emerging from the nozzle outlets, the nozzles being profiled and positioned to deposit vapour over the required web area.

The method may be used to coat web material with a film of almost any metal or alloy, for example copper or zinc. Many metal compounds such as oxides, or nitrides may also be deposited by reactive coating, the compounds being formed during the process by the controlled introduction of a gas, for example, oxygen or nitrogen between the evaporation source and the deposition zone. Thus, for example, the reactant gas may be accurately metered into or between the nozzles to react with the coating vapour, thereby effecting very accurate control of the relative proportions of vapour and reactant gas at the areas where they impinge on the web substrate and consequently effecting accurate control of the composition of the coating. If desired, different gases may be introduced at an independently variable flow rate at each of the areas where the vapour impinges on the substrate, thereby allowing the chemical compound and the relative amount of each chemical compound in the coating to be varied and controlled throughout the thickness of the composition.

The web substrate may comprise a wide variety of suitable materials such as plastic film or paper, the coatings having surface properties different from those of the substrate and providing, for example, decoration, reflectivity, storage improvement, magnetic, barrier or electrical properties, or releasable or reactive coatings.

The invention is especially suitable for coating thin substrates with thicker than usual coatings. For example, polymer substrates 10–50 micron thick may be readily coated with a 2–25 micron thick metal coating.

BRIEF DESCRIPTION OF THE DRAWINGS

The invention is further illustrated by the embodiments which are described, by way of example, with reference to the accompanying diagrammatical drawings wherein:

FIG. 3 is an elevation in section of an evaporator for use in web coating apparatus;

FIG. 4 is a cross-section on the line IV—IV of FIGS. 3 and additionally showing the configuration of a web cooling drum;

FIGS. 10 and 11 are fragmentary sectional views of further alternative nozzle arrays for the apparatus of FIG. 1.

DESCRIPTION OF EMBODIMENTS OF THE INVENTION

Figure 1:
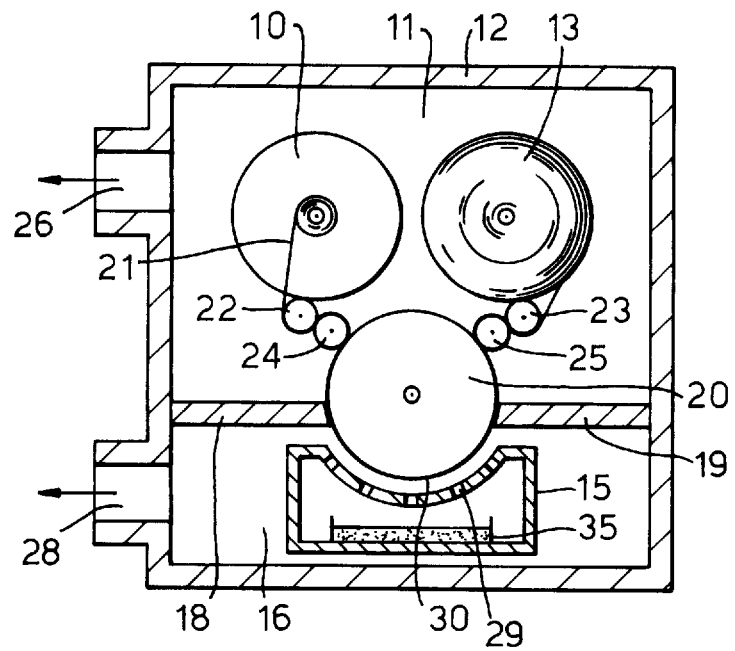
FIG. 1 shows in cross-section, a web coating apparatus of the invention arranged for single sided coating.

In the apparatus shown in FIG. 1 a web pay-off roll 10 and a web take-up roll 13 are contained in a compartment 11 of a vacuum chamber 12, and an evaporator 15 is located in a compartment 16 of chamber 12. The compartments 11 and 16 are separated by baffles 18 and 19 which extend inwardly from the inner wall of chamber 12 to a portion adjacent to a chilled drum 20. Web substrate 21 to be coated is advanced in a continuous manner from pay-off roll 10 over the curved surface of chilled drum 20 to take-up roll 13. Between the roll 10 and drum 20, and between roll 13 and drum 20 there are tensioning rolls 22 and 23 and guide rolls 24 and 25. A small clearance between the baffles 18 and 19 and the drum 20 allows free passage of the web substrate, but is sufficiently narrow to allow the pressure in the compartments 11 and 16 to be different during the deposition process and thereby prevent the vapour from reaching the web transport system. The compartments 11 and 16 can be evacuated through ports 26 and 28 respectively. The evaporator 15 is provided with five outlet nozzles 29, which are in the form of slots transverse to the substrate 21 and arranged sequentially around a deposition zone 30 on drum 20 in the direction of the substrate advance, the nozzles terminating on an arcuate surface substantially parallel to the curved surface of drum 20.

In operation the drum 20 is chilled by circulating cooling fluid and is rotated in synchronism with the pay-off roll 10 and take-up roll 13. The substrate 21 is fed over the surface of drum 20 and cooled before reaching the deposition zone 30 on drum 20 where vapour from the evaporator 15 is deposited on the substrate surface and adheres to the surface as a uniform coating.

Figure 2:
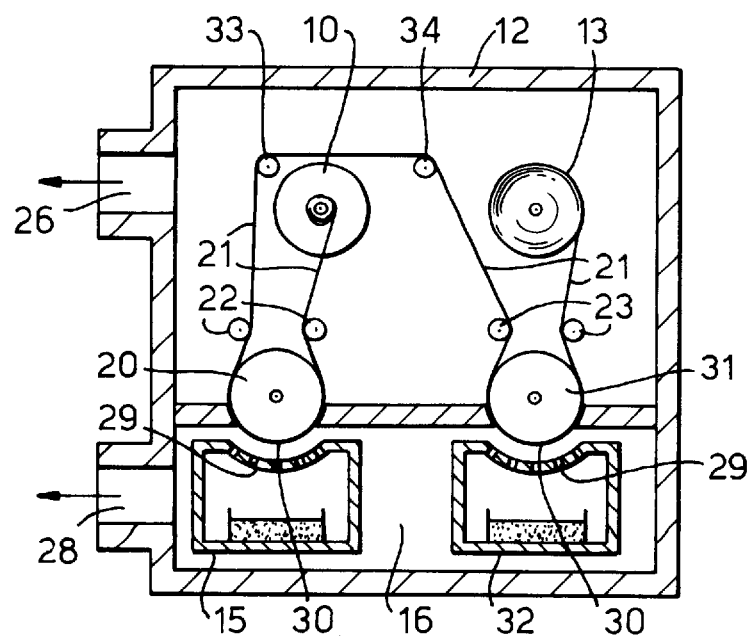
FIG. 2 shows in cross-section, a further web coating apparatus arranged for coating both sides of a web.

The arrangement shown in FIG. 2 contains two chilled drums 20 and 31 and two evaporators 15 and 32 and additional guide rolls 33 and 34 are arranged so that the opposite sides of the substrate are respectively coated by the evaporators.

An evaporator 15 is shown in detail in FIGS. 3 and 4. FIG. 4. also shows the relative positions of the nozzles 29 and the web substrate 21 at the deposition zone 30. The evaporator 15 comprises a crucible 35 in which the material 36 to be deposited on the substrate 21 is contained and evaporated. The crucible is encased in a retort 37 which in turn is encased in multiple layers of radiation shielding 38, the shielding 38 being backed by a fluid cooled shield 42 over the sides and bottom of the retort 37. The retort 37 has a lid 39 which is sealed to the body of the retort by a seal 40 and firmly held in position by clamps 41. Lid 39 is provided with spaced outlet nozzles 29, in the form of linear slots extending through the shielding 38 and terminating on an arcuate surface having a curvature roughly conforming to the curvature of the chilled drum 20 when viewed in cross-section as shown in FIG. 4. The nozzles 29 extend across the width of the web substrate 21 and are disposed sequentially in the direction of travel of the web 21. The retort 37 further contains a heating element 43 having power connecting leads 44 extending through and sealed into the bottom of the retort 37. A manifold 45 located outside the retort and connected to a source of inert gas (not shown) has one or more nozzles 46 extending through and sealed into the side of the retort 37.

In use, chamber 12 is evacuated, the web substrate 21 is continuously advanced, the material 36 is heated and evaporated and the vapour is emitted from the ends of the nozzles 29 to impinge on the moving substrate at the deposition zone 30 where it condenses on the substrate. The vapour is deposited sequentially from each nozzle 29 at any given transverse linear position on the substrate so that the film of condensed material is deposited progressively, allowing the structure and uniformity of the coating to be well controlled.

When a quantity of the coated product is required to be removed from the take-up roll 13, the evaporation of material 36 is stopped by the introduction of inert gas through nozzle 46 until the vapour pressure of the material is exceeded in the retort 37. The pressure in compartment 11 can then be increased to atmospheric and the coated product removed. The compartment 11 and retort 37 can then be re-evacuated and the coating process re-started. The inert gas should be one which does not react with the coating material to an extent which would impair the properties of the coating. Suitable inert gases include argon, helium, nitrogen or mixtures thereof.

If access to the crucible 35 or the heating element 43 is required sufficient inert gas to cool the retort 37 and its contents is introduced through the nozzle 46. The cooling efficiency may be increased by introducing the inert gas under conditions of turbulent flow and by recirculating the inert gas through refrigerating means (not shown). In order to minimise the stoppage time the cooling time can be shortened by constructing the retort 37, crucible 35, heating element 43 and shielding 38 with materials having low heat capacity. For this reason the shielding may advantageously comprise refractory metal and the heating element may be constructed of stainless steel.

Figure 5:
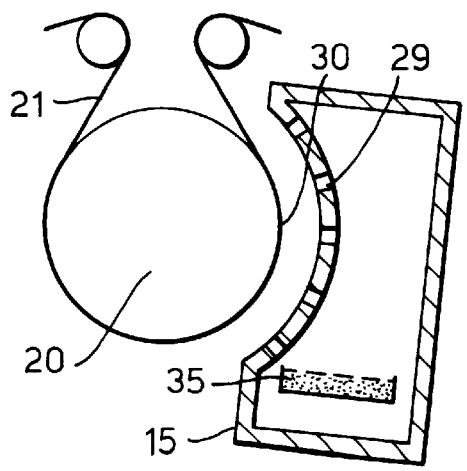
FIG. 5 is a fragmentary sectional view of an alternative orientation of the apparatus units of FIG. 1.

In FIG. 5 the evaporator 15 has an arcuate array of nozzles similar to that shown in FIG. 4 and is located at one side of the chilled drum 20, so that the vapour from the nozzles 29 is directed in a generally horizontal direction against the web substrate 21 in the deposition zone 30. One or more evaporators 15 may be orientated around the drum 20, effectively enlarging the deposition zone.

Figure 6:
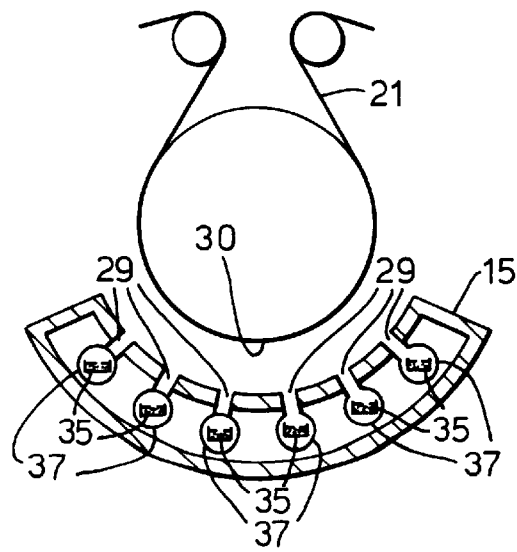
FIGS. 6–12 are fragmentary sectional views showing alternative modifications of nozzle arrays for the apparatus of FIG. 1.

In the apparatus modification shown in FIG. 6 the evaporator 15 contains 6 retorts 37 each containing a crucible 35 containing material to be vaporised and having a single nozzle 29, the nozzles being disposed sequentially and terminating on an arc around the deposition zone 30. The crucibles 35 are heated by a common heating means; they need not contain identical materials.

Figure 7:
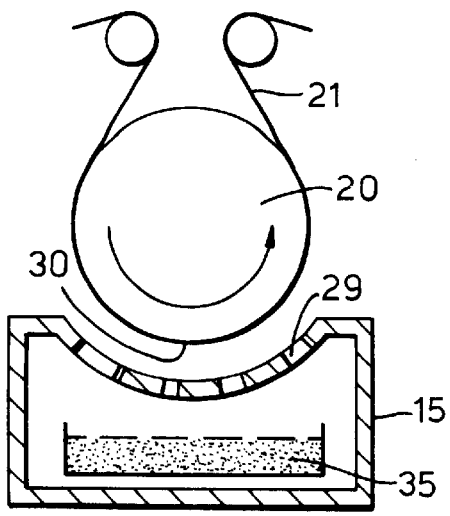

In the apparatus modification of FIG. 7 the evaporator 15 is similar to that shown in FIGS. 4 and 5 but the width of the sequence of nozzles 29 is progressively increased. This is advantageous for the application of heavy coatings which add to the thermal mass of the web. As the coating is progressively built-up the web is able to withstand more heat load for a given temperature rise so that more material may be deposited, in this case by a progressive widening of the nozzles.

Figure 8:
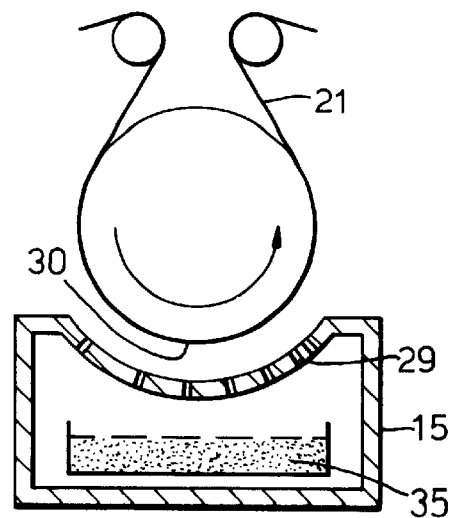

In the apparatus modification shown in FIG. 8 the evaporator 15 is similar to that shown in FIG. 7, but the width of the nozzles 29 remains constant and the nozzle spacing is progressively reduced, thereby giving the same advantage for heavy coating as the modification of FIG. 7.

Figure 9:
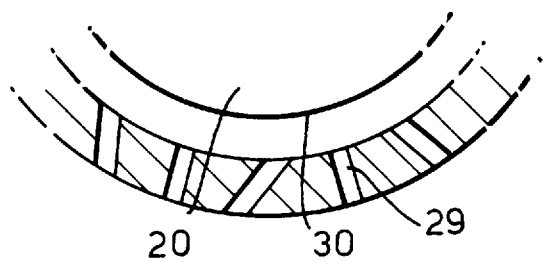

The modification shown in FIG. 9 illustrates how the nozzle direction can be varied to control the direction in which the vapour impinges on the web substrate. In some cases this may affect the properties of the coating. The nozzle direction may also be varied to prevent unvaporised particles travelling directly from the surface of material in the crucible 35 to the web substrate at the deposition zone 30 and adversely affecting the quality of the coating.

Figure 10:
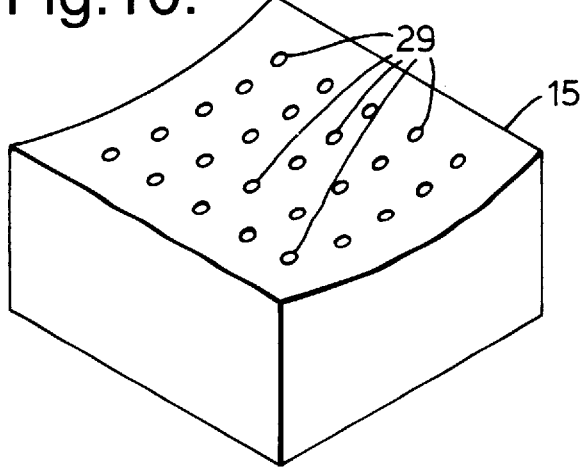

The nozzle array shown in FIG. 10 consists of lines of spaced nozzles 29 of circular cross section arranged in a sequence of lines lying transverse to the direction of the web substrate advance, the nozzle outlets lying on an arcuate surface.

Figure 11:
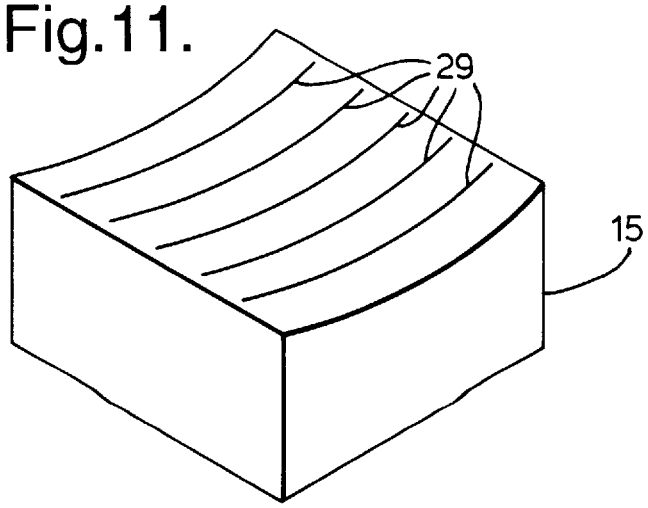

The nozzle array shown in FIG. 11 consists of a sequence of slots orientated in the direction of the web substrate advance with the nozzle outlets on an arcuate surface and the slots being in sequence transverse to the direction of the web substrate advance.

Figure 12:
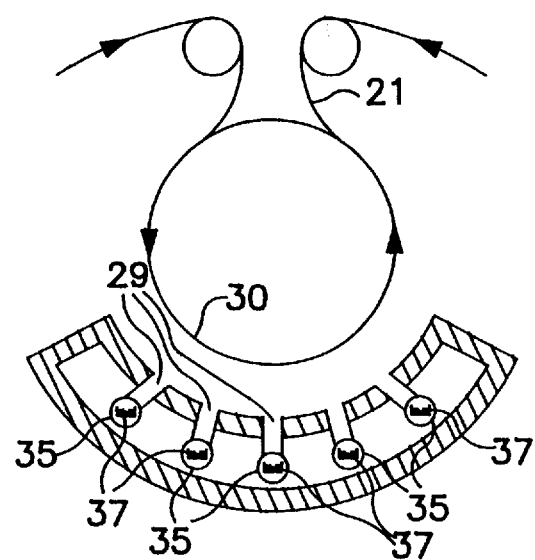

FIG. 12 shows yet another embodiment of the nozzle arrangement in accordance with this invention wherein the nozzle array consists of a plurality of nozzles 29 adapted to provide an approximately equal flow of vapour arrayed with the nozzel ends terminating along an arcuate surface. The nozzle arcuate surface and the curved surface of the drum are located convergent in the direction of the web advance.

Specific Example

The practice of the invention is further illustrated by the following Example.

EXAMPLE

A 25 micron thick web of capacitor grade paper commercially available from M H Dielectrics, Mount Holly Springs, Pa., USA, was fed at a rate of 2.5 meters/minute over a chilled roll having a radius of 30 cms, rotating in a vacuum chamber at a pressure of $8 \times 10^{-4}$ millibars. Zinc vapour, evaporated from 6 retorts arranged as shown in FIG. 6, flowed through 6 elongated nozzles (29) each 38 mm wide and extending over the width of the chilled roll (20), the nozzle exits being disposed at 15 cm spacing on an arcuate surface having a diameter of 45 cm.

The temperature of the retorts was 630° C. and a 3.0 micron thick coating of zinc was deposited on the paper, the variation of the coating being ±5% by weight over the area of the web.

The coating process could be commenced 22 minutes after the start of heating the evaporator and evacuating the vacuum chamber. Evaporation of the zinc could be stopped instantaneously by feeding argon gas at a pressure 700–900 millibars around the nozzle exits. By circulating argon gas around the retorts the evaporator could be cooled in 40 minutes to a temperature at which the uncoated paper supply and the zinc in the retorts could safely be replenished.

We claim:

1. Apparatus for vacuum web coating comprising a vacuum chamber containing at least one rotatable cooling drum providing at a curved surface thereof at least one deposition zone;

a web transport system for advancing a web substrate to be coated over said curved surface along a path through said deposition zone;

and evaporation means for vaporizing coating material to be deposited on said web;

said evaporation means providing a plurality of separately spaced outlet nozzles operatively disposed to convey a vapour from said evaporation means to portions of said deposition zone along said web path, at which portions said vapour is in operation condensed on the surface of the advancing web, said evaporation means further comprising at least two sealed retorts having a common heating means adapted to vaporize coating material in said retorts, and at least one of said plurality of nozzles connected to each of said at least two retorts; and a single or plurality of outlet ends of said nozzles being disposed on an arcuate surface around but spaced from the curved surface of the drum.

2. Apparatus as claimed in claim 1 wherein at least one retort has a sealed removable lid wherein at least one outlet nozzle is located.

3. Apparatus as claimed in claim 1 wherein the outlet nozzles comprise at least one continuous slot extending over the width of the web to be coated.

4. Apparatus as claimed in claim 3 wherein the outlet nozzles comprise a plurality of linear slots disposed transversely to the web substrate path to deliver vapour to portions of the deposition zone disposed sequentially in the direction of the web substrate advance.

5. Apparatus as claimed in claim 1 wherein the nozzles vary in profile, the upstream nozzles being adapted to provide a lower deposition rate than downstream nozzles.

6. Apparatus as claimed in claim 1 wherein the nozzle profiles are adapted to provide an approximately equal flow of vapour and the curved surface of the drum and the arcuate surface at which the nozzle ends are located are convergent in the direction of the web advance.

7. Apparatus as claimed in claim 1 wherein the nozzles are adapted to provide equal vapour flow and are disposed in sequence along the web path at decreased spacing in the direction of the web advance.

8. Apparatus for vacuum web coating comprising:

1) a vacuum chamber containing at least one rotatable cooling drum having a curved surface;

2) at least one deposition zone along said curved surface;

3) a web transport system for advancing a web substrate to be coated over said curved surface along a path through said deposition zone;

wherein said deposition zone includes:

a) evaporation means for vaporizing coating material to be deposited on said web;

b) a plurality of vapour outlet nozzles connected to said evaporation means disposed along said curved surface in the direction of the advancing web, and spaced therefrom, for providing a plurality of distinct deposition areas along the web transport direction.

9. The apparatus according to claim 8 wherein the evaporation means comprises at least one sealed retort wherein coating material can be vaporized, each retort having at least one vapour outlet nozzle connected thereto.

10. The apparatus according to claim 9 wherein at least one retort has a sealed removable lid and the outlet nozzle is connected to said lid.

11. The apparatus according to claim 8 wherein at least one outlet nozzle extends transverse to the web transport direction the full width of the web.

12. The apparatus according to claim 8 wherein the plurality of vapour outlet nozzles comprises a plurality of linear slots disposed transversally to the web path to deliver vapour to portions of the web disposed sequentially along the web path.

13. The apparatus according to claim 8 wherein the plurality of nozzles vary in profile, upstream nozzles being adapted to provide lower deposition rates than downstream nozzles.

14. The apparatus according to claim 8 wherein the plurality of nozzles are arranged along an arcuate path convergent with the web path in the direction of the web transport, and have profiles adapted to provide approximately equal flow of vapour.

15. The apparatus according to claim 8 wherein the plurality of nozzles are arranged in a sequence along the web path at progressively decreasing distance from the web, and have profiles adapted to provide approximately equal flow of vapour.

* * * * *